United States Patent
Park

[19]

[11] Patent Number: 5,904,564
[45] Date of Patent: May 18, 1999

[54] METHOD FOR FABRICATING MOSFET HAVING COBALT SILICIDE FILM

[75] Inventor: Sang Hoon Park, Ich'on, Rep. of Korea

[73] Assignee: Hyundai Electronics Industries Co., Ltd., Ich'on, Rep. of Korea

[21] Appl. No.: 08/991,668

[22] Filed: Dec. 16, 1997

[30] Foreign Application Priority Data

Dec. 27, 1996 [KR] Rep. of Korea ............... 96-72822

[51] Int. Cl.⁶ ........................................ H01L 21/44
[52] U.S. Cl. ................... 438/683; 438/685; 438/607; 438/653; 438/655
[58] Field of Search .................... 438/683, 685, 438/607, 653, 655

[56] References Cited

U.S. PATENT DOCUMENTS

| | | |
|---|---|---|
| 4,378,628 | 4/1983 | Levenstein et al. ............ 29/571 |
| 5,047,367 | 9/1991 | Wei et al. ....................... 438/607 |
| 5,510,295 | 4/1996 | Cabral, Jr. et al. ............. 438/656 |
| 5,780,361 | 7/1998 | Inoue ............................. 438/683 |
| 5,780,362 | 7/1998 | Wang et al. ................... 438/683 |

*Primary Examiner*—Olik Chaudhuri
*Assistant Examiner*—Daniel H Mao
*Attorney, Agent, or Firm*—Ware, Fressola, Van Der Sluys & Adolphson LLP

[57] ABSTRACT

Disclosed herein is a method for fabricating a metal oxide semiconductor field effect transistor having cobalt silicide. According to the method, there is first provided a semiconductor substrate having exposed silicon portions on the surface thereof. The exposed silicon is either single crystalline silicon or polycrystalline silicon, and may include junction regions in which N typed or P typed impurity such as arsenic, phosphorous, or boron is formed. Niobium and cobalt are sequentially deposited on the exposed silicon portions by electron-beam evaporation method. Afterwards, annealing step is performed to form a cobalt silicide film on the exposed silicon portions.

32 Claims, 3 Drawing Sheets

METHOD FOR FABRICATING MOSFET HAVING COBALT SILICIDE FILM

BACKGROUND OF THE INVENTION

1. Field of the Invention

The present invention generally relates to a semiconductor device having metal oxide semiconductor field effect transistor(MOSFET) structure, and more particularly to a method for fabricating a MOSFET having cobalt silicide metalization contact to the underlying silicon.

2. Description of the Related Art

Generally, with development of semiconductor fabrication technologies, MOSFETs are highly integrated in a semiconductor substrate. They have been essentially used as one of important elements in most digital signal processing apparatus. A MOSFET includes three terminals of source, drain and gate, and there is also provided a channel between electrically separated source and drain for transfer of carriers from source to drain, and vise versa.

In the above-mentioned MOSFET structure, with increase in integrity, there are strongly required shallow junction of the source and drain and suppression of parasitic capacitance which are both very important factors in capability of the MOSFET. In order to satisfy the above requests, there is proposed a technology forming metal silicides of compound of metal and silicon on source, drain and gate. As an advanced technology for the formation of such silicide films, there is proposed a self-aligned silicide(salicide) formation method, which simplifies steps for forming silicide layer on source, drain and gate.

FIG. 1 shows a conventional MOSFET structure in accordance with the self-aligned silicide formation method.

Referring to FIG. 1, there is provided a silicon substrate 1 in which device isolation oxides 2 are formed. Here, an active region is defined by two device isolation oxides. Gate 4 of polycrystalline silicon(hereinafeter referred to as "polysilicon") overlying gate oxide 3 is formed on a selected portion of the active region of the substrate 1. Lightly doped impurity regions 5 are selectively formed in the substrate 1 at both sides of the gate 4 by ion implantation. Spacers 6 of silicon dioxide($SiO_2$) are formed on side walls of the gate 4 by a known method. Thereafter, heavily doped impurity regions of source 7a and drain 7b are formed by ion implantation of high concentration and subsequent annealing. Afterwards, metal film is deposited at a selected thickness on the whole surface of the substrate 1. Thereafter, the substrate 1 is then annealed at a selected temperature, so as to react the deposited metal film with the underlying silicon, whereby metal silicide film 8 is formed. Thereafter, metal or metal compound which does not react with the underlying silicon are removed by selective etch.

The above-described self-aligned silicide formation method are useful in deep sub-micron MOSFETs.

Titanium disilicide($TiSi_2$) has been widely used in such MOSFET structure because of its low resistivity. However, since titanium used for the formation of the titanium disilicide has high reactivity with silicon dioxide ($SiO_2$), it comes to be frequently reacted with the silicon dioxide, thereby forming a titanium silicide film on the device isolation oxide where titanium silicide need not be formed. The unnecessary titanium silicide film formed on the spacers or the device isolation oxide electrically connects the source, drain, and gate with each other, so that the MOSFET does not serve as switching element. In addition, since high stress by titanium silicide film causes defects to be generated in the source, drain and gate, electrical characteristic and reliability of the MOSFET are deteriorated.

In order to solve the above problems, there is proposed use of cobalt silicide for titanium silicide. The cobalt silicide however needs a large amount of silicon for the formation thereof to a desired thickness, so that it is difficult to form stable and shallow junction of source and drain. Moreover, the heating of the cobalt silicide to a temperature above about 1,000° C. increases surface energy of the cobalt silicide grains. The high surface energy leads to an agglomeration of large silicide grains during the annealing process. As a consequence, the cobalt silicide film formed in accordance with the conventional method has a low flatness, so that its contact resistance with the underlying silicon increases.

SUMMARY OF THE INVENTION

Accordingly, it is an object of the present invention to provide a method for fabricating a MOSFET having cobalt silicide, capable of securing shallow junction and low contact resistance.

It is another object of the present invention to provide a MOSFET having cobalt silicide, capable of decreasing leakage current.

According to one aspect of the present invention, there is first provided a semiconductor substrate having exposed silicon portions on the surface thereof. The exposed silicon is either single crystalline silicon or polycrystalline silicon, and may include junction regions in which N type or P type impurity such as arsenic, phosphorous, or boron is formed. Niobium and cobalt are sequentially deposited on the exposed silicon portions by electron-beam evaporation technique. Afterwards, annealing step is performed to form a cobalt silicide film on the exposed silicon portions.

In accordance with other aspect of the present invention, there is provided a method for fabricating a MOSFET. The method comprises the steps of: providing a semiconductor substrate in which device isolation oxides are formed; forming a gate including a gate insulator interposed between the gate and the substrate; forming source and drain regions in the substrate at both sides of the gate; forming spacers of insulator on both side walls of the gate; sequentially depositing niobium and cobalt on the entire surface of the resultant substrate; annealing the resultant substrate at a selected temperature, to form a cobalt silicide film on the source, drain, and gate; and removing residuals except the cobalt silicide.

In accordance with another aspect of the present invention, there is provided a method for fabricating a MOSFET comprising the steps of: providing a semiconductor substrate in which device isolation oxides are formed; sequentially depositing silicon oxide layer, polysilicon layer, amorphous silicon layer, and anti-reflective layer on the semiconductor substrate, and patterning the deposited four layers, to form a gate and a gate insulator interposed between the gate and the substrate; implanting an N-type impurity at a low concentration into the substrate including the gate, to form lightly doped regions in the substrate at both sides of the gate; forming spacers of insulator on both side walls of the gate; removing the anti-reflectivelayer; implanting the N-type impurity into the substrate, at a concentration higher than that of the lightly doped regions to form source and drain regions; sequentially depositing niobium and cobalt on the resultant substrate to form source and drain regions; annealing the resultant substrate at a selected temperature, to form a cobalt silicide film on the source, drain, and gate; and removing residuals except the cobalt silicide.

BRIEF DESCRIPTION OF THE DRAWINGS

These and other features, aspects, and advantages of the present invention will become better understood with reference to the following description, appended claims, and accompanying drawings, wherein

DETAILED DESCRIPTION OF THE INVENTION

A preferred embodiment of the present invention will be described with reference to the accompanying drawings.

FIGS. 2A–2D are cross-sectional views for explaining the fabricating method of an MOSFET in accordance with a specific embodiment of the present invention.

Figure 1:
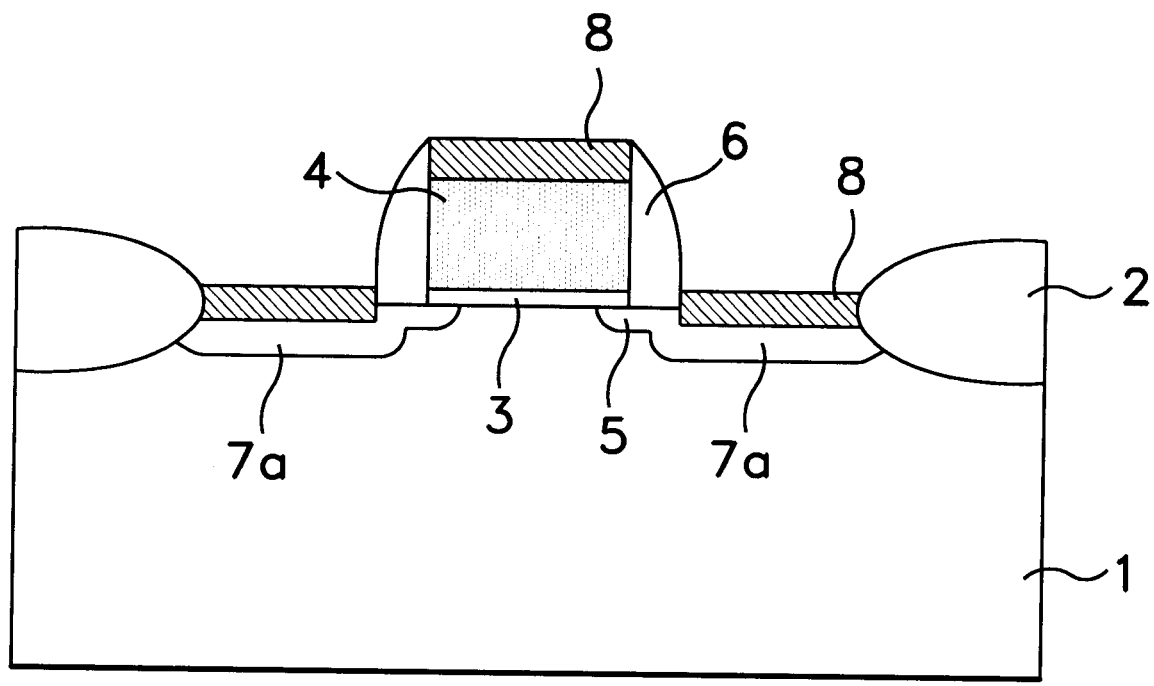
FIG. 1 shows a conventional MOSFET structure in accordance with the self-aligned silicide formation method.
Figure 2A:
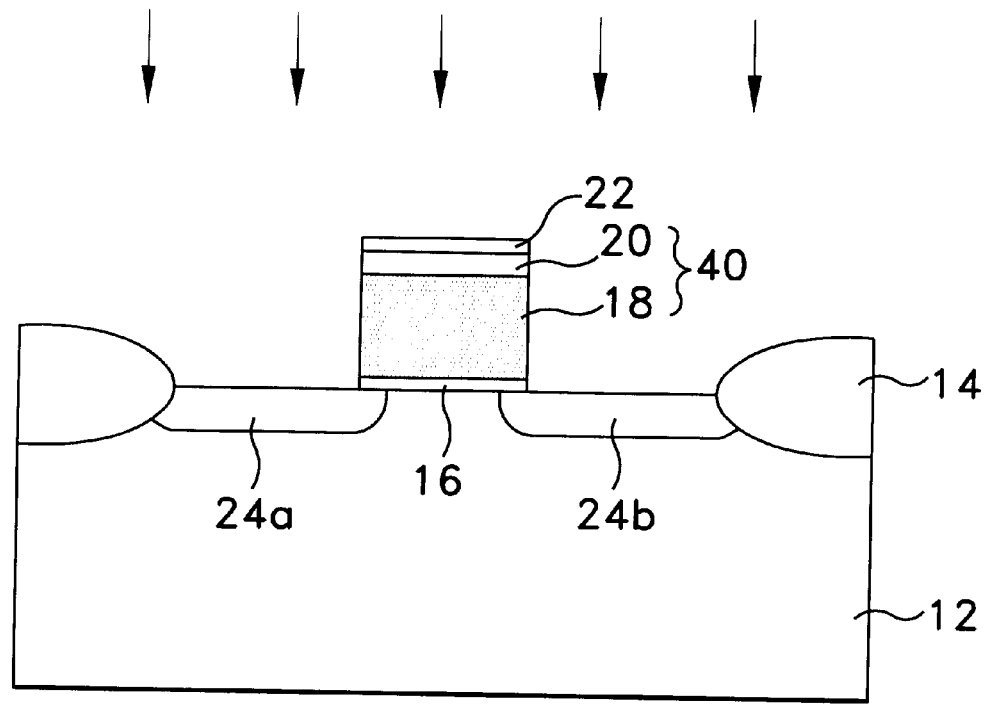
FIGS. 2A–2D are cross-sectional views for explaining the fabricating method of an MOSFET in accordance with a specific embodiment of the present invention.

Referring to FIG. 2A, there is first provided a semiconductor substrate 12 which can be composed of a bulk type silicon substrate or a silicon on insulator(SOI) substrate comprising a handling wafer, a buried insulating layer formed on the handling wafer and a silicon layer formed on the buried insulating layer. The SOI substrate is prepared by either bonding technique or separation by implanted oxygen (SIMOX) technique. According to the bonding technique, a first silicon wafer having an insulating layer formed thereon and a handling wafer are prepared. The first silicon wafer is attached to the handling wafer such that the insulating layer of the first silicon wafer faces the surface of the handling wafer. The silicon layer of the first silicon wafer is polished to a selected thickness, resulting in a layer for the formation of devices. In accordance with the SIMOX method, oxygen ions for the formation of the buried insulating layer are deeply implanted into a silicon wafer to form a buried insulating layer.

Returned to FIG. 2A, a device isolation oxide 14, normally made of $SiO_2$ is formed at selected portions of the substrate 12 by a well-known local oxidation of silicon (LOCOS) method, to define active regions where semiconductor devices are formed. Thereafter, for the formation of gate oxide 16 and gate 40, silicon oxide, polysilicon, amorphous silicon, and anti-reflectivelayers are sequentially deposited in the order named on the substrate 12 at respective selected thickness and are patterned. Here, the gate 40 consists of a polysilicon pattern 18 and a amorphous pattern 20, but the amorphous pattern 20 may be omitted. The patterned anti-reflectivelayer 22 is to prevent deterioration of photoresist mask due to the reflection of incident light for the patterning of photoresist film as coated on the above-mentioned four layers, but may be omitted. As the patterned polysilicon 18, N-impurity or P-impurity doped polysilicon can be used. And, the patterned amorphous silicon 20 is preferably formed at a thickness of about 100 to 500 Å.

In order to prevent generation of hot carriers due to short channel effect in the MOSFET structure, lightly doped impurity regions may be provided in the substrate 12 at both sides of the gate 40. For the purpose of forming the lightly doped impurity regions, N-impurity such as arsenic or phosphorous is implanted at a selected impurity concentration into the entire surface of the substrate 12 including the gate 40, thereby forming $N^-$ impurity doped regions 24a, 24b of low concentration.

Figure 2B:
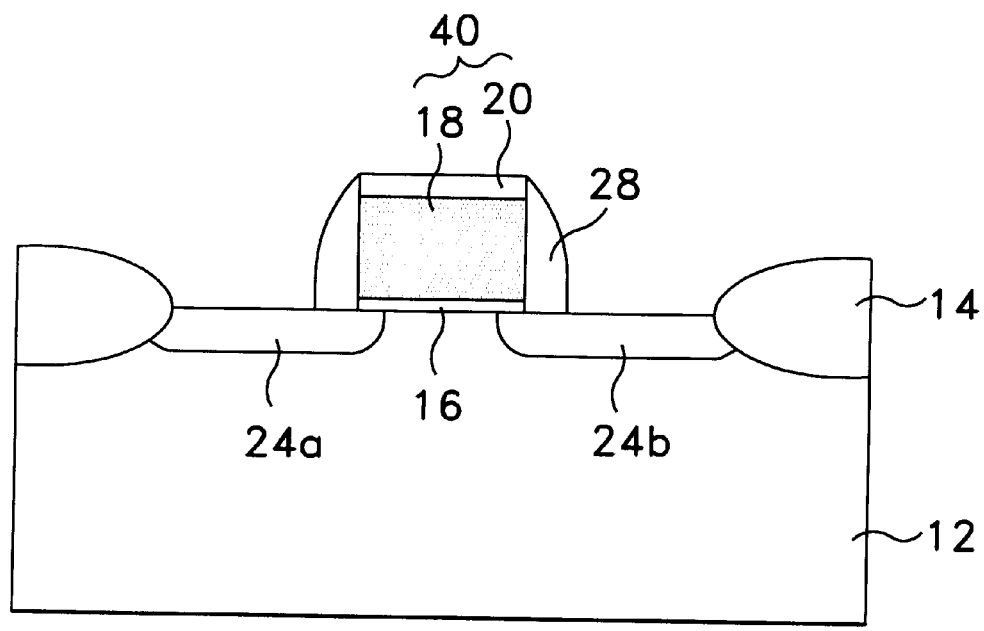

Referring to FIG. 2B, on the side walls of the gate 40, there are provided spacers 28 made of silicon dioxide. The spacers 28 are formed by depositing silicon dioxde at a thickness of 2000–3000 Å by a chemical vapor deposition on the entire surface of the substrate 12 including the gate 40 and afterwards performing blanket etch until the silicon dioxide on the source 24a and drain 24b and the anti-reflectivelayer 22 are completely removed. At this time, the anti-reflectivelayer 22 is also removed. The above-mentioned anti-reflectivelayer 22 may be removed before the formation of the spacers 28.

Figure 2C:
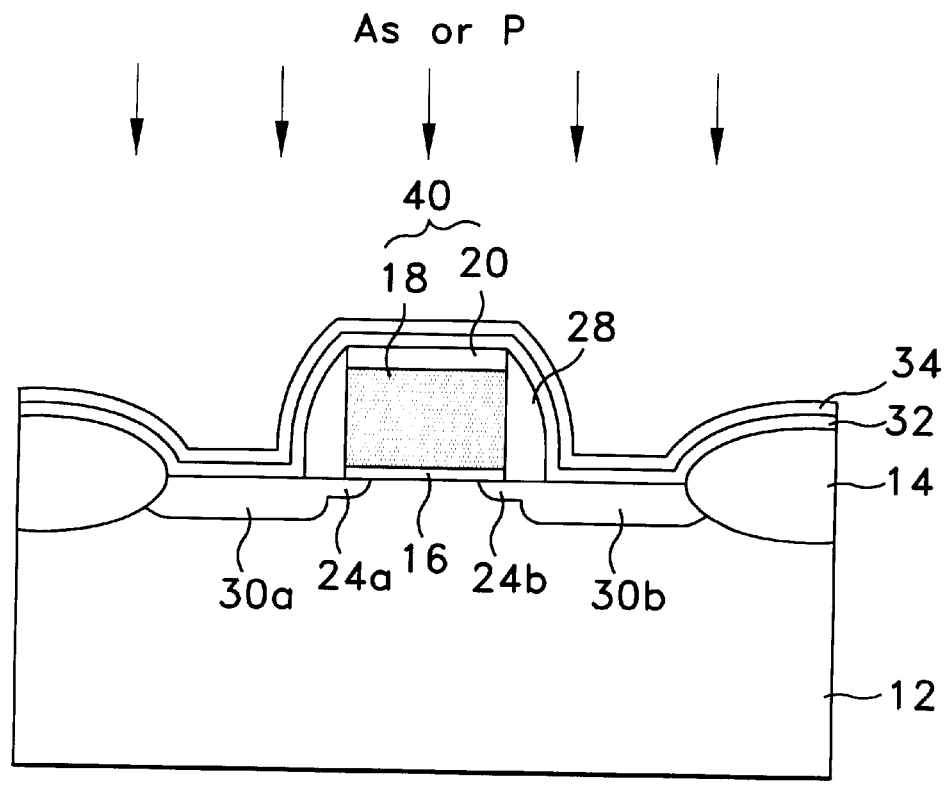

Referring to FIG. 2C, $N^+$ impurity doped regions 30a and 30b of high concentration which are generally referred to as source and drain, are formed in the silicon substrate 12 by implanting N-type impurity ions of high concentration into the entire surface of the substrate 12.

Niobium film 32 with about 200–500 Å thickness and cobalt film 34 with about 200–500 Å thickness are sequentially deposited on the entire surface of the substrate 12 by electron-beam evaporation technique. At this time, pressure of a chamber for the deposition of the niobium film 32 and the cobalt film 34 must be maintained below $1\times10^{-7}$ Torr such that the metal films as deposited have superior qualities.

Figure 2D:
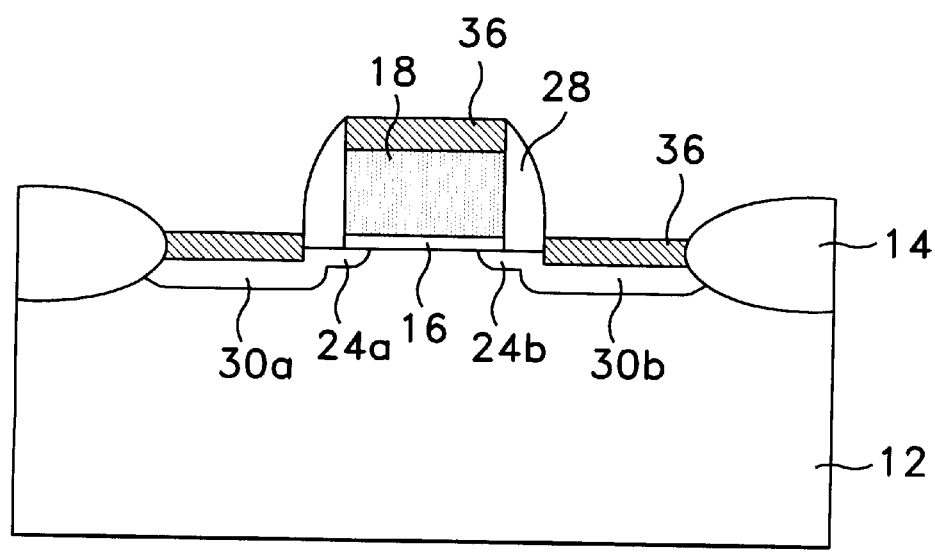

Referring to FIG. 2D, the substrate resulting from the above mentioned steps is thermally annealed in a temperature range of 800–900° C., in nitrogen atmosphere, thereby forming crystalline cobalt silicide film 36 on the source, drain, and gate regions. Here, the thermal anneal continues to proceed until the amorphous silicon 20 is completely consumed for the formation of the cobalt silicide film 22. After the thermal anneal is completed, residuals such as $Nb_2O_5$, a compound of Co and Nb, and cobalt-rich silicide other than the cobalt disilicide($CoSi_2$) are removed by selective etch.

Mechanism for the formation of the cobalt disilicide including the residuals is described below.

Silicon dioxide($SiO_2$) has Gibb's free energy Gf of about $-204.7$ Kcal/mol, while $Nb_2O_5$ has Gibb's free energy of about $-422.1$ Kcal/mol. The Gibb's free energy of the $Nb_2O_5$ is larger than that of the silicon dioxide. Thus, in case that the above structured MOSFET is thermally annealed in nitrogen atmosphere, Nb is oxidized by reaction with oxygen in silicon dioxide at interfaces of Co and Nb, and Nb and Si, to form thin film of $Nb_2O_5$. Also, during the thermal anneal, since Si is slower in diffusion rate than Co, it is difficult that the Si atoms diffuse into the Co film through the films of $Nb_2O_5$, Nb, and the compound of Nb and Co which are previously existed or are generated by reaction during the thermal anneal. Accordingly, Co atoms having diffusion rate faster than Si atoms diffuse into the Si layer through the Nb film and react with the silicon atoms to form cobalt silicide. Cobalt disilicide($CoSi_2$) known as having the lowest resistivity and being the most stable phase among compounds of cobalt and silicon, is formed at a relatively high temperature of 550° C. Then, Niobium disilicide ($NbSi_2$) is formed at a temperature of about 650° C. relatively higher than the formation temperature of $CoSi_2$. Also, an activation energy for $CoSi_2$ is about 1.5–2.0 eV, and that for $NbSi_2$ is about 2.7 eV. Thus, since the activation energy of $NbSi_2$ is higher than that of $CoSi_2$, $NbSi_2$ is hardly formed in case that a temperature for the thermal anneal is maintained at about 550° C. In further detail, in initial reaction stage before $CoSi_2$ is formed at the interface of silicon and niobium, a small amount of silicon atoms are diffused into niobium film. However, niobium atoms react easily with oxygen atoms compared to silicon atoms due to its high oxidation characteristic. In other words, since oxidation degree of niobium is the highest of metal atoms except tantalum, oxidation of niobium preferentially occurs. Also, since niobium has a high reactivity with cobalt, a reaction between niobium and cobalt is abruptly occurred, to create a small amount of a ternary compound of niobium, cobalt, and silicon. The ternary compound reacts with the overlying residual cobalt, thereby forming cobalt silicide such as CoSi and/or $CoSi_2$. As a result, $NbSi_2$ is hardly formed at a temperature of about 550° C. Thus, intermediate phases such as $Nb_2O_5$, the compound of Nb and Co created during silicidation of cobalt and silicon serve as a barrier against abrupt interdiffusion, thereby forming a superior, good quality, stable cobalt disilicide. Moreover, niobium film disposed between cobalt and silicon during the silicidation process, prevents outdiffusion of the doped impurities toward the cobalt silicide film being formed, so that it is possible to obtain shallow, stable junctions.

As described in detail above, the present invention provides the following effects.

First, amount of silicon used in forming the cobalt disilicide is relatively small, thereby facilitating shallow junction to be formed. In addition, during heating of the cobalt disilicide to temperature above about 1,000° C. which is performed at subsequent process, surface energy of the cobalt silicide grains does not increase, so that an agglomeration of large silicide grains does not occur. Moreover, penetration of grains into the junction regions of source and drain decreases, an epitaxial regrowth of silicon between the silicide grains does not occur. As a result, leakage currents of such silicided junctions are decreased.

Meanwhile, unlike the above mentioned self-aligned silicide MOSFET structure, the inventive method can be applied to a semiconductor device having exposed silicon portions requiring the formation of cobalt silicide film thereon. At this time, substrate may be made of either single crystalline silicon or polysilicon, and may include junction regions in which N type or P type impurity such as arsenic, phosphorous, or boron is doped.

It will be apparent to those skilled in the art that various modification and variations can be made in the semiconductor device and method of fabricating the same of the present invention departing from the spirit or scope of the invention. Thus, it is intended that the present invention cover the modifications and variations of this invention provided they come within the scope of the appended claims and their equivalents.

What is claimed is:

1. A method for fabricating a MOSFET having cobalt silicide, the method comprising the steps of:
   providing a semiconductor substrate having exposed silicon portions on the surface thereof;
   sequentially depositing niobium and cobalt in the order named on the exposed silicon portions; and
   annealing the resultant substrate, to form a cobalt silicide film on the exposed silicon portions.

2. The method as claimed in claim 1, wherein the semiconductor substrate is single crystalline silicon substrate.

3. The method as claimed in claim 1, wherein the semiconductor substrate is SOI substrate.

4. The method as claimed in claim 1, wherein the exposed silicon portions are of crystalline silicon.

5. The method as claimed in claim 1, wherein the exposed silicon portions are of amorphous silicon.

6. The method as claimed in claim 5, wherein the amorphous silicon is formed to a thickness of 100–500 Å.

7. The method as claimed in claim 1, wherein the niobium is deposited to a thickness of about 200–500 Å.

8. The method as claimed in claim 1, wherein the cobalt is deposited to a thickness of about 100–500 Å.

9. The method as claimed in claim 1, wherein the cobalt is deposited to a thickness of about 200–500 Å and the niobium is deposited to a thickness of about 100–500 Å.

10. The method as claimed in claim 1, wherein the cobalt and niobium are both deposited by electron beam evaporation technique.

11. The method as claimed in claim 10, wherein pressure of a chamber used in the electron beam evaporation technique is maintained below $1 \times 10^{-7}$ torr.

12. The method as claimed in claim 1, wherein the thermal anneal is performed at a temperature of 800–900° C.

13. A method for fabricating a MOSFET having cobalt silicide, the method comprising the steps of:
    providing a semiconductor substrate in which device isolation oxides are formed;
    forming a gate including a gate insulator interposed between the gate and the substrate;
    forming source and drain regions in the substrate at both sides of the gate in the substrate;
    forming spacers of insulator on both side walls of the gate;
    sequentially depositing niobium and cobalt in the order named on the entire surface of the resultant substrate; and
    annealing the resultant substrate at a selected temperature, to form a cobalt silicide film on the source, drain, and gate.

14. The method as claimed in claim 13, wherein the gate has a stacked structure that amorphous silicon layer is stacked on polysilicon layer.

15. The method as claimed in claim 14, wherein the amorphous silicon is about 100–500 Å thick.

16. The method as claimed in claim 13, wherein the niobium is deposited to a thickness of about 200–500 Å.

17. The method as claimed in claim 13, wherein the cobalt is deposited to a thickness of about 100–500 Å.

18. The method as claimed in claim 13, wherein the cobalt is deposited to a thickness of about 200–500 Å and the niobium is deposited to a thickness of about 100–500 Å.

19. The method as claimed in claim 13, wherein the cobalt and niobium are both deposited by electron beam evaporation technique.

20. The method as claimed in claim 19, wherein pressure of a chamber used in the electron beam evaporation technique is below $1 \times 10^{-7}$ torr.

21. The method as claimed in claim 13, wherein the source and drain regions comprise lightly doped region that is doped at a concentration lower than the source and drain regions.

22. The method as claimed in claim 13, wherein the thermal anneal is performed at a temperature of 800–900° C.

23. A method for fabricating a MOSFET having cobalt silicide, the method comprising the steps of:
    providing a semiconductor substrate in which device isolation oxides are formed;
    sequentially depositing silicon oxide layer, polysilicon layer, amorphous silicon layer, and anti-reflectivelayer in the order named on the semiconductor substrate, and patterning the deposited four layers, to form a gate and a gate insulator interposed between the gate and the substrate wherein the two patterned layers of the amorphous silicon layer and the polysilicon layer correspond to the gate and the silicon oxide to the gate insulator;
    implanting an N-type impurity at a low concentration into the substrate including the gate, to form lightly doped regions in the semiconductor substrate at both sides of the gate;

forming spacers of insulator on both side walls of the gate;

removing the anti-reflective layer;

implanting the N-type impurity into the substrate, at a concentration higher than that of the lightly doped regions to form source and drain regions, wherein each of the lightly doped regions is in contact with the source and drain regions and is disposed under the spacers;

sequentially depositing niobium and cobalt on the resultant substrate having the source and drain regions; and annealing the substrate resulting from the depositing step at a selected temperature, to form a cobalt silicide film on the source, drain, and gate.

24. The method as claimed in claim 23, wherein the amorphous silicon is about 100–500 Å thick.

25. The method as claimed in claim 23, wherein the niobium is deposited to a thickness of about 200–500 Å.

26. The method as claimed in claim 23, wherein the cobalt is deposited to a thickness of about 100–500 Å.

27. The method as claimed in claim 23, wherein the cobalt is deposited to a thickness of about 200–500 Å and the niobium is deposited at a thickness of about 100–500 Å.

28. The method as claimed in claim 23, wherein the cobalt and niobium are both deposited by electron beam evaporation technique.

29. The method as claimed in claim 28, wherein pressure of a chamber used in the electron beam evaporation method is below $1 \times 10^{-7}$ torr.

30. The method as claimed in claim 23, wherein the spacers is of silicon dioxide.

31. The method as claimed in claim 23, wherein the thermal anneal is performed at a temperature of 800–900° C.

32. The method as claimed in claim 23, wherein the thermal anneal is performed until the amorphous silicon reacts with the cobalt and is thus completely consumed.

* * * * *

UNITED STATES PATENT AND TRADEMARK OFFICE
CERTIFICATE OF CORRECTION

PATENT NO. : 5,904,564
DATED : May 18, 1999
INVENTOR(S) : S. Park

It is certified that error appears in the above-identified patent and that said Letters Patent is hereby corrected as shown below:

At column 4, line 37, prior to "Gf", please insert -- $\varDelta$ --.

Signed and Sealed this

Second Day of November, 1999

Attest:

Q. TODD DICKINSON

*Attesting Officer*     *Acting Commissioner of Patents and Trademarks*